US009823860B2

United States Patent
Vauclair et al.

(10) Patent No.: US 9,823,860 B2
(45) Date of Patent: Nov. 21, 2017

(54) ONE-TIME PROGRAMMING IN REPROGRAMMABLE MEMORY

(71) Applicant: NXP B.V., Eindhoven (NL)

(72) Inventors: Marc Vauclair, Overijse (BE); Philippe Teuwen, Etterbeek (BE)

(73) Assignee: NXP B.V., Eindhoven (NL)

( * ) Notice: Subject to any disclaimer, the term of this patent is extended or adjusted under 35 U.S.C. 154(b) by 226 days.

(21) Appl. No.: 14/213,732

(22) Filed: Mar. 14, 2014

(65) Prior Publication Data

US 2015/0261458 A1 Sep. 17, 2015

(51) Int. Cl.
| | |
|---|---|
| *G06F 3/06* | (2006.01) |
| *G11C 7/10* | (2006.01) |
| *G11C 16/22* | (2006.01) |
| *G11C 17/16* | (2006.01) |
| *G11C 11/00* | (2006.01) |
| *G11C 13/00* | (2006.01) |

(52) U.S. Cl.
CPC .......... *G06F 3/0619* (2013.01); *G06F 3/0652* (2013.01); *G06F 3/0679* (2013.01); *G11C 7/1045* (2013.01); *G11C 13/0069* (2013.01); *G11C 16/22* (2013.01); *G11C 17/165* (2013.01); *G06F 2206/1014* (2013.01); *G11C 11/005* (2013.01); *G11C 13/0035* (2013.01); *G11C 13/0059* (2013.01); *G11C 2013/0083* (2013.01)

(58) Field of Classification Search
None
See application file for complete search history.

(56) References Cited

U.S. PATENT DOCUMENTS

| | | | |
|---|---|---|---|
| 5,768,192 A | 6/1998 | Eitan | |
| 5,896,398 A * | 4/1999 | Sekine | G11C 29/52 714/720 |
| 8,010,738 B1 * | 8/2011 | Chilton | G11C 16/349 711/103 |
| 2005/0120186 A1 | 6/2005 | Happ et al. | |
| 2007/0069276 A1 | 3/2007 | Scheuerlein et al. | |

(Continued)

FOREIGN PATENT DOCUMENTS

EP   2045814 A1   4/2009

OTHER PUBLICATIONS

"EEPROM Emulation with Wear-Leveling for 8-Bit Flash MCUs" Silicon Laboratories, AN798, Rev. 0.1 10/13, (2013), 6 pages.

(Continued)

*Primary Examiner* — Daniel Tsui
*Assistant Examiner* — Leandro Villanueva (57) ABSTRACT

A portion of a reprogrammable storage device is used to implement permanent data storage. The storage device includes a plurality of electrically erasable memory elements and a controller. The plurality of electrically erasable memory elements are configured to store data. Each memory element is programmable a number of write cycles before reaching a write failure state. The controller is coupled to the plurality of memory elements. The controller includes a receiver and a write engine. The receiver receives an instruction to drive a selected memory element to the write failure state. The write engine repeatedly writes a data value, in a plurality of write operations, to the selected memory element until the write failure state of the selected memory element is established.

15 Claims, 4 Drawing Sheets

(56) References Cited

U.S. PATENT DOCUMENTS

| | | | | |
|---|---|---|---|---|
| 2008/0229163 A1* | 9/2008 | Niijima | ............... | G11C 29/56 |
| | | | | 714/719 |
| 2009/0063916 A1* | 3/2009 | Vogelsang | ......... | G11C 29/4401 |
| | | | | 714/719 |
| 2010/0217917 A1* | 8/2010 | Bryant-Rich | .......... | G11C 16/22 |
| | | | | 711/103 |
| 2011/0107010 A1* | 5/2011 | Strauss | ............... | G11C 16/10 |
| | | | | 711/103 |
| 2012/0060054 A1* | 3/2012 | Sun | ................... | G06F 12/0246 |
| | | | | 714/6.13 |

OTHER PUBLICATIONS

Kim et al. "3-Transistor Cell OTP ROM Array Using Standard CMOS Gate-Oxide Antifuse" Journal of Semiconductor Technology and Science, vol. 3, No. 4, (Dec. 2003), pp. 205-210.

Chen et al. "EEPROM Bit Failure Investigation" 6th Military and Aerospace Programmable Logic Devices International Conference, (Sep. 9, 2003), 7 pages.

Hong "Comparison of Embedded Non-Volatile Memory Technologies and Their Applications" Kilopass, NVMP IP White Papers, (May 2009), 8 pages.

European Search Report, 15157372.2, dated Jul. 20, 2015.

* cited by examiner

ONE-TIME PROGRAMMING IN REPROGRAMMABLE MEMORY

Electronic memory device generally can be classified as one-time-programmable (OTP) or reprogrammable memory devices. There is also another special purpose memory device referred to as multiple-time programmable (MTP) memory devices which involves changes to the production process of the wafers.

OTP memory devices have memory elements that are accompanied by an electrical fuse or antifuse. Once a data value is programmed into an OTP memory element, the fuse is blown creating a permanently open circuit, or the antifuse is programmed creating a permanently closed circuit. This prevents the OTP memory element from being reprogrammed to store a different data value. The OTP memory element retains the written data value indefinitely, or as long as the stored state can physically be retained by the memory element (data retention may be limited, for example, in a floating gate transistor by electron drift through the insulator).

Reprogrammable memory devices allow individual blocks (e.g., bytes, pages, or other segmentations) of data to be erased and/or rewritten over time. In this way, the data on a reprogrammable memory device may be overwritten with new data. Each operation to write or rewrite data to the memory element is designated as a write cycle. Usually, these devices can endure thousands (e.g., 3,000-5,000 or more) of write cycles while still guaranteeing the ability to accurately read the data from the individual memory elements.

Electrically erasable programmable read-only memory (EEPROM) and flash are examples of currently available types of reprogrammable memory device. EEPROM and flash memory media have individually erasable segments that can be rewritten many times before becoming unreliable. Some reprogrammable memory devices track and store data write information in order to track the cumulative use, or wear, on individual memory elements, blocks, or segments. Hence, this information is also referred to as wear information. Some memory devices also use wear leveling techniques to distribute write operations across different blocks or segments of memory elements in order to avoid wearing out one block or segment of memory faster than other blocks or segments on the same device.

In conventional circuit designs, memory devices are dedicated as either OTP or reprogrammable memory devices. Consequently, two separate dedicated memory devices are required in order to implement both OTP and reprogrammable memory in the same circuit design. The duplication of memory devices can be very costly in terms of design time and chip size. Also, OTP memory devices consume a relatively large area of silicon, in comparison to some types of reprogrammable memory devices. Additionally, OTP memory devices are subject to hardware investigations and unauthorized bit recovery (e.g., using an electron microscope), while at least some types of reprogrammable memory devices cannot be easily investigated or read.

Embodiments of a storage device are disclosed. In one embodiment, the storage device includes a plurality of electrically erasable memory elements and a controller. The plurality of electrically erasable memory elements are configured to store data. Each memory element is programmable a number of write cycles before reaching a write failure state. The controller is coupled to the plurality of memory elements. The controller includes a receiver and a write engine. The receiver receives an instruction to drive a selected memory element to the write failure state. The write engine repeatedly writes a data value, in a plurality of write operations, to the selected memory element until the write failure state of the selected memory element is established. Other embodiments of the storage device and corresponding system are also described.

Embodiments of a method are also described. In one embodiment, the method includes receiving an instruction to drive a selected block of memory elements to a write failure state to permanently store a data value. The method also includes performing a plurality of repetitive write operations to write the data value to the selected block of memory elements from a plurality of electrically erasable memory elements. The method also includes confirming that the data value is not changed by a different write operation. Other embodiments of the method are also described.

Other aspects in accordance with the invention will become apparent from the following detailed description, taken in conjunction with the accompanying drawings, illustrated by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments implement equivalent OTP functionality in a reprogrammable memory device. Rather than implement fuses (or antifuses) into the memory chip design, permanent storage capabilities can be achieved in reprogrammable memory devices by writing a data value as many times as needed to force the corresponding memory element(s) into a write failure state. By driving the memory element(s) to the write failure state, the written data value becomes burned or fused into the memory element(s). This prevents a subsequent write operation from changing the stored data value.

As used herein, the term "permanent" is used to describe storing a data value that cannot be changed by a subsequent write operation. It is understood, however, that the actual electrons stored in the memory location may change over time due to other factors such as retention failure. Retention failure may be due to the migration of stored electrons through an adjacent insulator, which results in fewer electrons stored over time. Thus, the description herein of "permanently" writing data to a memory location refers to the inability to write new data in the same location, but does not imply any constraints on the retention capabilities of any particular storage technology.

Also, while the description herein often refers to EEPROM and its functionality, other types of memory devices and technology also may implement the functionality (or equivalent functionality). Some embodiments may be implemented with specific reference to flash memory (addressable in blocks instead of bytes), and some embodiments may be implemented with external memory such as SmartMedia or xD Picture Card memory formats. While each type of reprogrammable memory may store data in different ways, the description herein refers to memory elements as the fundamental storage size for a single bit of data (or the smallest atomic size possible with the corresponding technology). The memory elements may be operated on as blocks or other grouped segmentations for convenience in reading, writing, and/or erasing data on the memory device.

Embodiments of the permanent storage functionality described herein may be implemented on a portion, or fraction, of the memory elements within a memory device. For devices which implement blocks, this means that some of the blocks may be used to permanently store data values, while the remaining blocks can be used for ongoing reprogramming of data values. A map or other tracking data structure may be used to store designations as to which blocks (or other segments) are reserved for use to store permanent data values. Conversely, the tracking data structure may designate reprogrammable blocks, while the remaining blocks are used for permanent data storage. Alternatively, in some embodiments, all of the memory elements within a memory device may be used to store permanent data values (which may be equivalent in some ways to a dedicated OTP memory device).

Implementing the functionality described herein on a portion or fraction of a memory device may be facilitated with various types of memory by changing design parameters. Many types of potential memory technologies are being explored today, in order to compete with EEPROM, and those proposed designs are intended to minimize aging problems by allowing millions or billions of write cycles, or more. In some embodiments, it may be possible to alter design parameters and/or fabrication techniques to purposefully reintroduce potential aging issues on only a fraction of the memory elements in a memory device. In this way, the affected memory elements may be used for OTP memory storage, without impacting the increased aging and writability of other memory elements on existing memory device designs.

Figure 1:
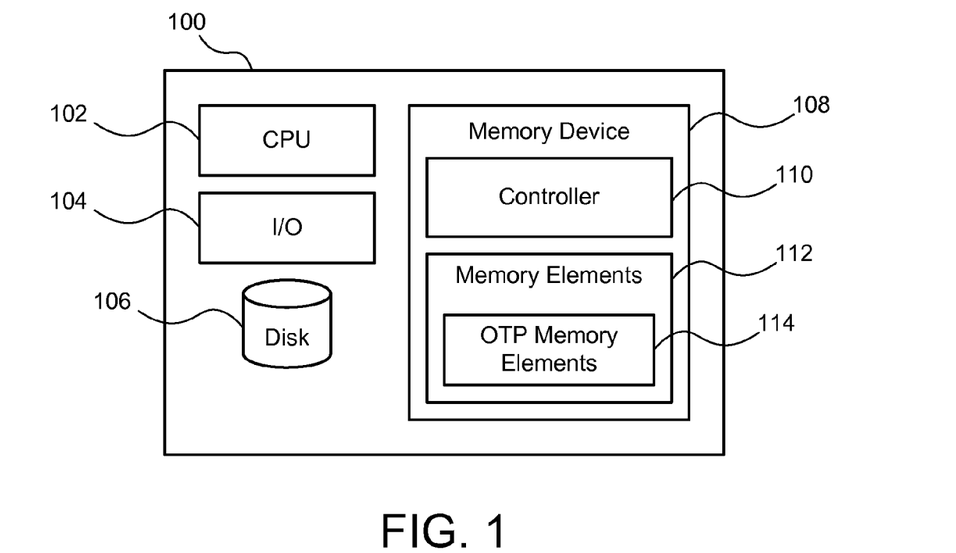
FIG. 1 depicts a schematic block diagram of one embodiment of a computer device with data storage capabilities.

FIG. 1 depicts a schematic block diagram of one embodiment of a computer device 100 with data storage capabilities. The illustrated computer device 100 includes a processor (CPU) 102, an input/output (I/O) manager 104, a storage device 106, and an electronic memory device 108. Although the illustrated computer device 100 is shown with certain components and described with certain functionality herein, other embodiments of computer devices and systems may include fewer or more components to implement the same, less, or more functionality.

The computer device 100 may include other typical components found in typical computing devices, including, but not limited to, circuitry (busses, bridges, etc.) which facilitate the communication of data throughout the computer device 100 and between the several components within the computer device 100. In general, the computer device 100 may be any type of computing device, including, but not limited to, a personal computer, a tablet, mobile device, peripheral device, workstation, network server, router, switch, or any other device which includes a memory device 108, as described below. In some embodiments, the computer device 100 may exclude some or all of the additional components describe herein, with the exception of the memory device 108, or an equivalent hardware device for storing data that can be reprogrammed in addition to data that cannot be reprogrammed.

In general, the processor 102 is any type of data processing device or combination of data processing devices. The processor 102 executes instructions to cause the computer device 100 to implement operations. In some embodiments, the processor 102 loads and executes an operating system that provides an interface for user interactions. The processor 102 also may load a file or other data structure management system to manager files or other data structures stored on the computer device 100. The computer device 100 is not limited in the type of processor 102 and/or processing functions 102 that can be performed by the processor 102.

In one embodiment, the I/O manager 104 facilitates receiving input to and providing output from the computer device 100 to a user and/or another computing device. The I/O manager 104 may interface with one or more peripheral devices (not shown) such as a keyboard, a mouse, a trackball, a touch pad, a display screen, a telephone, a wireless transceiver, an indicator light, a speaker, and so forth. The computer device 100 is not limited in the type of I/O functions that can be managed by the I/O manager 104.

In one embodiment, the storage device 106 stores files and/or other data structures or information in a non-volatile storage device. The storage device 106 may implement a file system or other organization structure for the stored information. In some embodiments, the processor 102 may access information stored on the storage device 106 in order to retrieve and execute one or more instructions related to the operation of the computer device. Also, the storage device 106 may store one or more software programs or applications, or portions thereof, which can be executed by the processor 106. The computer device 100 is not limited in the type of storage device 106, the type of information that may be stored, and/or the organizational structure or other functionality of the storage device 106.

The depicted memory device 108 includes a controller 110 and a plurality of memory elements 112. At least some of the memory elements 112 are designated for permanent data storage. These designated memory elements 112 are referred to herein as OTP memory elements 114, because they provide permanent storage functionality that is similar to conventional OTP memory elements, except within a reprogrammable memory environment. However, the designation of these memory elements at OTP memory elements does not require the use of fuses or antifuses, or other conventional technology, that might be used in conventional OTP memory elements. Alternatively, these designated memory elements 114 may be referred to as permanent memory elements, reserved memory elements, or another similar designation. In any case, the designation used for these memory elements 114 does not require any conventional or special functionality other than what is described in the individual embodiments herein.

At least some of the embodiments described herein implement OTP memory elements within an EEPROM memory device. While different embodiments may exhibit various properties, embodiments that use EEPROM technology allow OTP functionality to be implemented in substantially smaller areas of silicon than conventional technology that uses fuses and antifuses. Some embodiments of flash memory can implement about 100 bits in the same area required for 1 bit in conventional OTP memory devices. He capacity advantage of EEPROM and flash memory devices may lead to additional uses of OTP memory elements. Also, embodiments that use EEPROM technology to implement OTP functionality may be more secure than conventional OTP devices because OTP bits realized using EEPROM cannot be easily read using an electron microscope or other invasive reading technology. For similar reasons, EEPROM technology is not as prone to unauthorized hardware investigations. These characteristics make EEPROM one suitable choice for implementing OTP functionality in a reprogrammable memory device, rather than using a dedicated OTP memory device or trying to implement OTP functionality in another proposed reprogrammable technology.

The controller 110 is coupled to the memory elements 112 to allow the controller 110 to read data from the memory elements 112, erase data from the memory elements 112, and write data to the memory elements 112. Further details of embodiments of the controller 110 are provided below, in particular, in the description referencing FIG. 2.

Although the memory device 108 is illustrated with both the controller 110 and the memory elements 112, other embodiments may separate the functionality of the controller 110 from the memory elements 112. For example, the memory elements 112 may be implemented on an external memory device, while the controller 110 may be implemented on another device that is separate from, but in communication with the external memory device.

The memory elements 112 may be any type of reprogrammable memory elements. In one embodiment, the memory elements 112 are floating gate transistors. Other embodiments may implement versions of memory elements based on technologies such as charge trap flash, magnetoresistive random-access memory (MRAM), ferroelectric RAM, phase-change memory (PCM), silicon-oxide-nitride-oxide-silicon (SONOS), programmable metallization cells, resistive RAM, memristors, NvSRAM, Racetrack memory, Nano-RAM, Millipede memory, floating junction gate (FJG) RAM, Bubble memory, or other similar memory technologies.

In some embodiments, a fraction or portion of the memory elements 112 are reserved or designated for use as OTP memory elements 114. In this way, although the memory elements 112 are reprogrammable, the controller 110 may be allowed to drive the OTP memory elements 114 to a condition in which the OTP memory elements 114 are no longer reprogrammable. This can be achieved, in one embodiment, by forcing the OTP memory elements 114 into a write failure state or mode. Once the write failure state is achieved, subsequent write operations have little or no effect on the stored data value. In other words, additional write cycles do not significantly change the stored data value, or the data value that is interpreted from the stored signal or condition. Even though the actual electrons, signal, or other conditional characteristics of a memory element may change slightly, such slight changes would not be interpreted as a change in the bit values represented by the stored signal.

For certain types of memory technologies, the write failure state can be achieved by reprogramming the OTP memory elements 114 more than a number of write cycles. The number of write cycles, generally, may be known or estimated. Also, methods described herein can be used to confirm that one or more of the OTP memory elements 114 have reached the write failure state.

In alternative embodiments, other methods may be used in addition to, or instead of, the total number of write cycles. For example, in some embodiments, the write voltage applied to the OTP memory elements may be increased to accelerate toward the write failure state using a fewer number of write cycles. In another example, longer write times during some or all of the write cycles may accelerate toward the write failure state faster.

Figure 2:
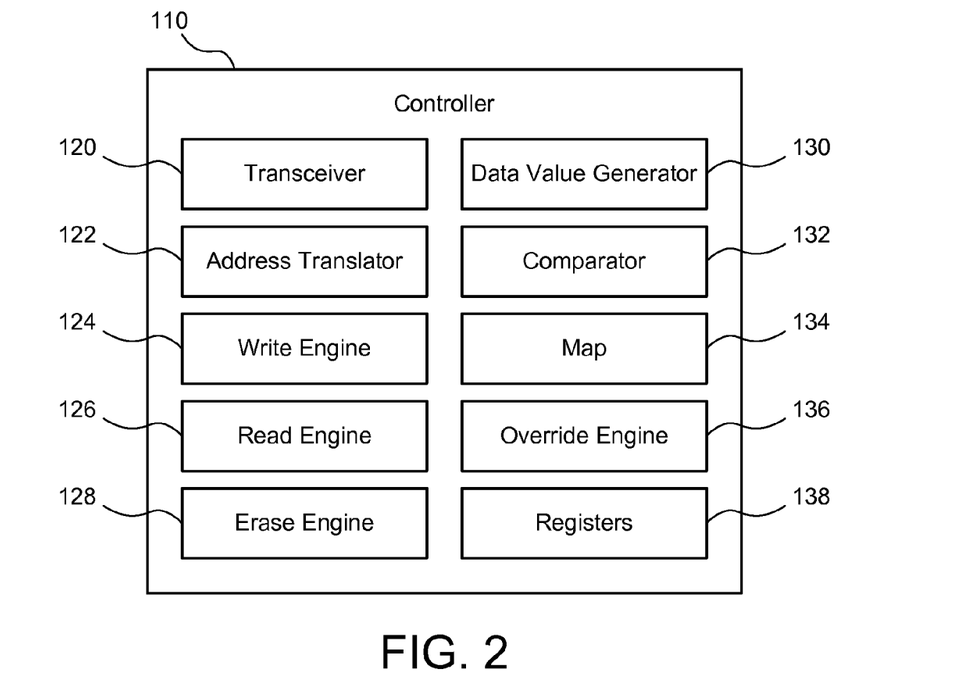
FIG. 2 depicts a schematic block diagram of a more detailed embodiment of the controller of the memory device of FIG. 1.

FIG. 2 depicts a schematic block diagram of a more detailed embodiment of the controller 100 of the memory device 108 of FIG. 1. The illustrated controller 110 includes a transceiver 120, an address translator 122, a write engine 124, and a read engine 126. The controller 110 also includes a data value generator 130, a comparator 132, a map 134, and one or more registers 138. Although the controller 100 is shown and described with certain components and functionality, other embodiments of the controller 100 may include fewer or more components to implement the same, less, or more functionality.

In one embodiment, the transceiver 120 includes hardware to receive signals (i.e., a receiver) from other computer components. For example, the transceiver 120 may include a receiver to receive instructions from the processor 102 to store data in the memory device 108. In some embodiments, those instructions also may designate to store data permanently in one of the OTP memory elements 114 or to store data temporarily in one of the other memory elements 112. Additionally, those instructions may provide indications of which memory elements 112 to designate as the OTP memory elements 114. In a more specific example, the receiver may receive an instruction to drive a selected OTP memory element 114 to the write failure state.

The transceiver 120 also may include hardware to transmit signals (i.e., a transmitter) to the other computer components. For example, the transceiver 120 may transmit data retrieved from one or more of the memory elements 112, in response to a read operation. Also, the transceiver 120 may transmit instruction confirmations to confirm the execution of instructions such as read instructions or instructions to designate certain memory elements 112 as OTP memory elements 114.

In one embodiment, the address translator 122 translates memory addresses from one addressing scheme to another addressing scheme. For example, the processor 102 may utilize logical addresses (e.g., a logical block address (LBA)) to reference memory locations, and the address translator 122 may translate those logical addresses to physical addresses (e.g., a physical block address (PBA)) to reference a specific physical memory location within the memory device 108. In other embodiments, more than two addressing schemes may be implemented, and the address translator 122 may translate between two or more of the addressing layers.

In general, the write engine 124 facilitates writing data to memory locations within the memory device 108. In some embodiments, the write engine 124 applies specific voltage levels to rows and/or columns of an array of the memory elements 112 in order to store voltage signals (i.e., electrons) at specific locations within memory device 108. Such voltage levels and techniques for writing to specific memory elements may be known in the art for known floating gate transistor characteristics. In other embodiments, the write engine 124 may store signals or states representative of bit values, byte values, or other data values in the memory locations using other techniques corresponding to the particular type of technology used to implement the memory device 108.

In some embodiments, the write engine 124 is directed to write data values to be stored permanently in the OTP memory elements. To accomplish this, the write engine 124 may repeatedly write a data value to the selected memory element, block, or other segmented location over the course of multiple write operations until the write failure state of the selected memory element, block, or other segmented location is established.

For electrically erasable memory elements, each memory element is programmable a number of write cycles before reaching the write failure state. The approximate number of write cycles used to achieve the write failure state may depend on the type of memory device 108 that is used. Hence, in some embodiments, the write engine 124 performs a predetermined number of the write operations to write the data value to the selected memory element. The write engine 124 may repeat sets of write operations until confirmation is achieved that the write failure state has been reached. Some methods for testing for the write failure state are described herein.

In one embodiment, the read engine 126 facilitates reading data from memory locations within the memory device 108. This may entail reading specific voltage levels from memory locations at intersections of the rows and columns of the array of memory elements 112 in the memory device 108. By reading out voltage levels of different memory locations, the digital bit values assigned to the corresponding voltage levels can then be determined and provided to the requesting component such as the controller 110 and/or processor 102.

In some embodiments, the read engine 126 is used to read stored data values from selected memory locations as part of the confirmation process to verify that the data stored in the selected memory locations is permanently written. Additional details of writing and reading data values during the confirmation process are described herein.

In one embodiment, the erase engine 128 facilitates erasing data from memory locations within the memory device 108. In some embodiments, erasing data involves applying reset or erasure voltages to selected memory locations in order to reset the voltage levels at those memory locations to a particular state. Depending on the convention, the erase state may correlate to a bit value of '0' or '1' in a convention where each memory location is configured to represent a single bit value. In other embodiments, other conventions may be used.

In some embodiments, the erase operation is paired with each write operation. For example, an erase operation may precede each write operation. In this way, each write cycle may include at least one erase operation. Alternatively, one or more erase operations may be performed separate from write operations.

In one embodiment, the data value generator 130 facilitates generation of a test data value that can be used in a write operation. While the data stored in the memory device 108 may typically be directed by the processor 102 or other components, in some embodiments, the controller 110 may attempt to write test data values to certain memory elements or locations within the memory device 108. These test data values may be arbitrary values or predetermined values. One purpose in trying to write test data values to memory locations is to determine whether the data already stored in the respective memory locations can or cannot be overwritten by the test data values. Thus, the test data values should be different from the data values that are already stored in the memory locations, and the controller may make comparisons to ensure that the test data values are unique and/or distinctive.

In one embodiment, the comparator 132 compares the test data value 130 that was attempted to be written to a memory location with the actual data value that is read from the same memory location. If the stored data value is the same as the test data value, then it is determined that the test data value was successfully written to the memory location. Hence, it is also concluded that the previous data value stored in the memory location, prior to writing the test data value, was not permanently stored in the memory location. In contrast, if the stored data value is different from the test data value that was attempted to be written, then it may be concluded that the previous data value was permanently written to the memory location. In some embodiments, additional comparisons may be performed to determine if the stored data value is the same as the previous data value, even after the intervening attempt to write the test data value to the memory location.

In further embodiments, the comparator 132 generates a comparison result of the comparison of the stored data value of the selected memory element to the test data value. As described above, the comparison result is indicative of whether the test data value is stored in the selected memory element, which may be further indicative of whether the previous data value is permanently stored in the memory location.

In some embodiments, the controller 110 may maintain a map 134 or other data structure to designate which memory elements, blocks of memory elements, or other segments of the memory elements are designated as the OTP memory elements 114. In this way, the map 134 or other data structure indicates the OTP memory elements 114 that can be driven to the write failure state for storage of fused data values that cannot be changed by subsequent write operations.

In one embodiment, the override engine 136 prevents wear leveling procedures for the memory elements or blocks of the memory elements designated in the map 134 for storage of the fused data values. If wear leveling procedures were not prevented for the OTP memory elements 114, then the wear leveling procedures would distribute successive write operations to different memory locations, with the objective of avoiding the write failure state. By preventing the wear leveling procedures for the OTP memory elements 114, repetitive write operations can drive the OTP memory elements 114 to the write failure state more quickly. In other embodiments, the controller 110 may use other techniques to limit the wear leveling techniques to the memory elements 112 that are not designated as OTP memory elements 114.

The wear leveling functionality with the computer device 100 may be implemented at different levels. In some embodiments, the wear leveling functionality is implemented by the controller 110. In other embodiments, the wear leveling functionality is implemented by the processor 102 in combination with an operating system (OS) flash driver (not shown). In other embodiments, the wear leveling functionality is implemented by the processor 102 in combination with a filesystem (e.g., JFFS, YAFFS, UBIFS, and so forth).

In one embodiment, the controller may use one or more registers 138 to store state information, data values (e.g., the written data values and the test data values), or other information that may be useful in the process of permanently writing data values to the OTP memory elements 114.

Figure 3:
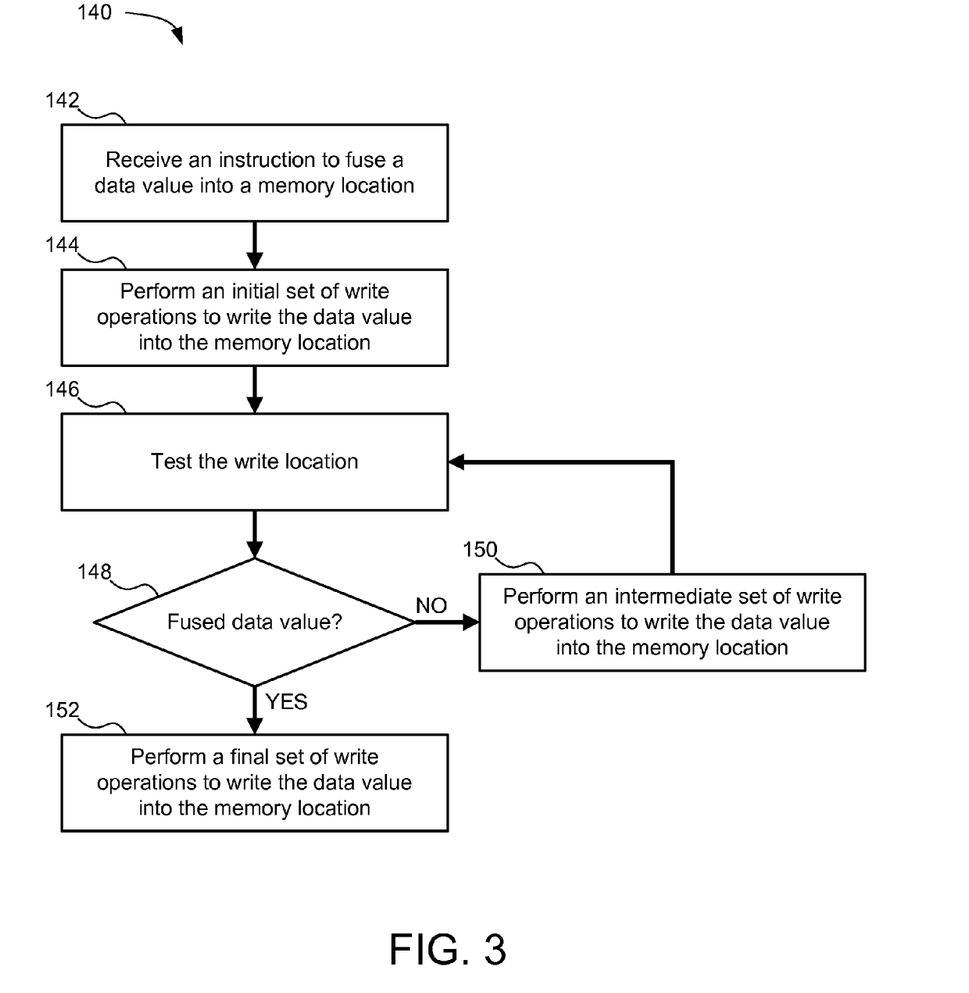
FIG. 3 depicts a flowchart diagram of one embodiment of a method for using a portion of a reprogrammable memory device for permanent write operations.

FIG. 3 depicts a flowchart diagram of one embodiment of a method 140 for using a portion of a reprogrammable memory device for permanent write operations. For convenience, the illustrated method 140 may be implemented with an embodiment of the computer device 100 and the controller 110 described above. Alternatively, the method 140 may be implemented with other reprogrammable memory devices and/or controllers for reprogrammable memory devices.

The depicted method 140 begins as the controller 110 receives 142 an instruction to fuse, or permanently write, a data value into a memory location. As explained above, the terms "fuse" and "permanently write" within this context refer to the ability to write data that is not changed by a subsequent write operation.

Figure 4:
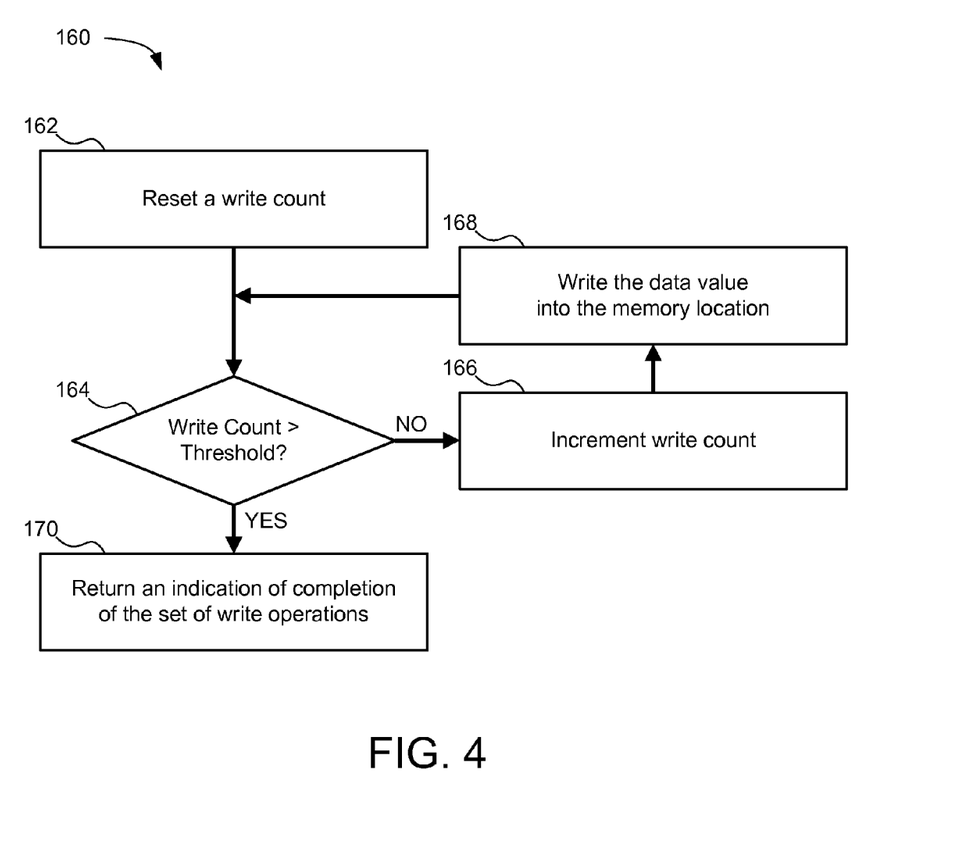
FIG. 4 depicts a flowchart diagram of one embodiment of a method for repetitively writing a data value to a memory location within the reprogrammable memory device.

The controller 110 then instructs the write engine 124 to perform 144 an initial set of write operations to write the data value into the memory location. The initial set of write operations may include a specified number of write operations, which may be established based on an estimated or published number of reliable write cycles for that type of memory device 108. FIG. 4 shows a more detailed embodiment of a method for writing a data value multiple times to a memory location.

Figure 5:
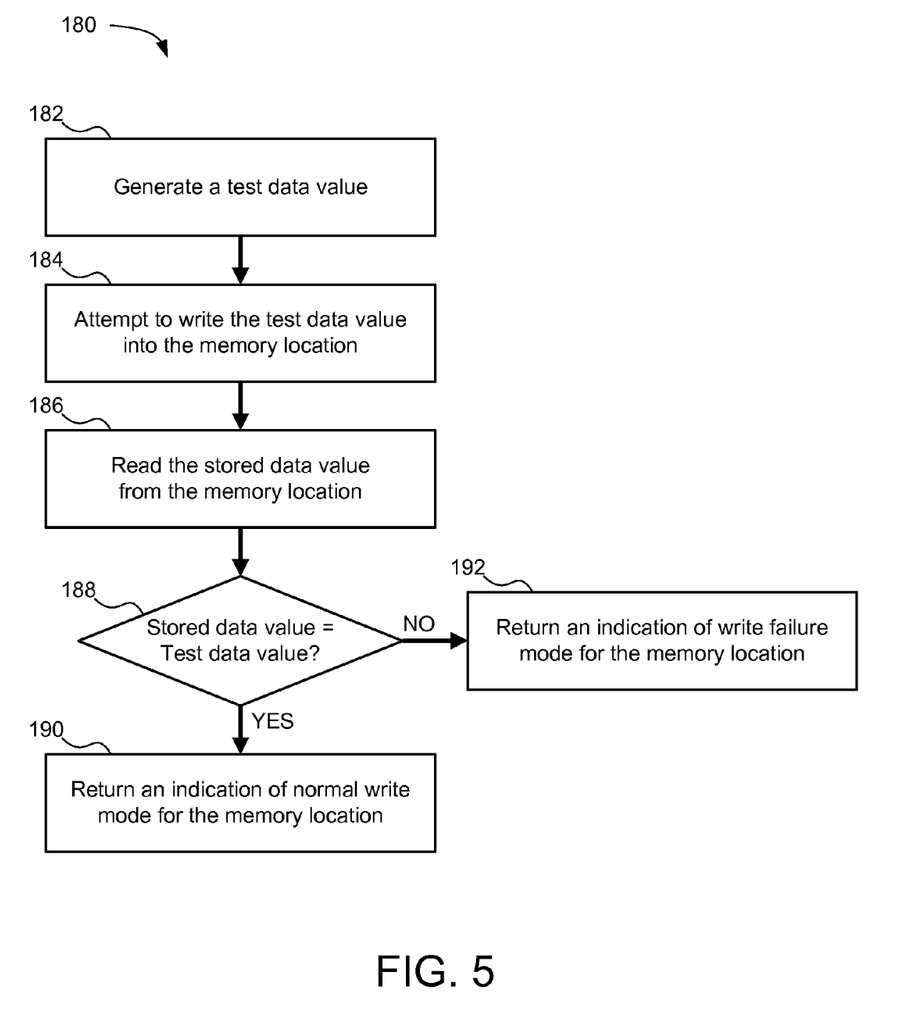
FIG. 5 depicts a flowchart diagram of one embodiment of a method for confirming the status of a data value permanently written to a memory location within the reprogrammable memory device.

After the initial set of write operations, the controller 110 performs 146 a test to determine 148 if the previously written data value (from the initial set of write operations) is permanently written to the corresponding memory location. FIG. 5 shows a more detailed embodiment of a method for testing a memory location.

If the previously written data value is not permanently written in the memory location, then the controller 110 performs 150 another set of write operations to write the same data value into the memory location. This subsequent set of write operations may be the same number or a different number or write operations than the initial set of write operations. In one embodiment, this subsequent set of write operations is about one order of magnitude smaller than the initial set of write operations. In another embodiment, the subsequent set of write operations is between about 50-300 write operations. In another embodiment, the subsequent set of write operations is between about 100-200 write operations. Other embodiments may implement other amounts of write operations. In further embodiments, the number of write operations may depend, at least in part, on a level of accuracy of the write operation performed to test the write location—a higher accuracy in the test write operation may result in a lower number of additional write operations, and vice versa.

In some embodiments, the controller 108 controls the write engine 124, the read engine 126, and the comparator 132 (and other components as needed) to repeat the write operation to write the test data value, the comparison, and additional sets of write operations, until the comparison result is indicative that the stored data value does not equal the test data value and, hence, the iteratively written data value is permanently stored in the memory location.

Once it is determined 148 that the iteratively written data value is permanently stored in the memory location, the controller 110 may instruct the write engine 124 to perform a final set of write operations to write the data value into the memory location. This final set of write operations may be about the same order of magnitude as the intermediate set of write operations. Alternatively, the final set of write operations may include another number of write operations. In other embodiments, this final set of write operations may be omitted.

In some embodiments, the controller 110 performs a first sequence of the write operations to repeatedly write the data value to a selected memory element or block. The first sequence of the write operations includes a number of write operations equal to or greater than a first threshold number of write cycles. The controller 110 then performs a second sequence of the write operations to write the data value to the selected memory element in response to a determination that the selected memory element can store a newly written data value.

In further embodiments, the read engine 126 reads a stored data value from the selected memory element after each sequence of the write operations. And the write engine 124 is further configured to repeat the second sequence of the write operations in response to a subsequent determination that the selected memory element can store another newly written data value. The depicted method 140 then ends.

FIG. 4 depicts a flowchart diagram of one embodiment of a method 160 for repetitively writing a data value to a memory location within the reprogrammable memory device. For convenience, the illustrated method 160 may be implemented with an embodiment of the computer device 100 and the controller 110 described above. Alternatively, the method 160 may be implemented with other reprogrammable memory devices and/or controllers for reprogrammable memory devices.

The depicted method 160 may be used to implement any or all of the sets of write operations described above. The depicted method 160 begins as the controller 110 resets a write count. In some embodiments, the write count is maintained in one of the registers 138. Alternatively, the write count may be stored in another location.

The controller 110 then checks 164 to see if the write count exceeds a count threshold. The count threshold also may be stored in a register 138 or in another location. The comparator 132 may be used to compare the write count and the threshold.

If the write count does not exceed the threshold, then the controller 110 increments 166 the write count and performs 168 a write operation to write the data value into the memory location. This accounts for one write cycle of the memory location. In some embodiments, each write operation is accompanied by a preceding erase operation.

The controller 110 continues to compare the write count to the threshold and perform additional write cycles until the threshold is met or exceeded (depending on the mathematical operator used). Once the threshold is met or exceeded, the comparator 132 can return 170 an indication to the controller 110 that the present set of write operations is complete. The depicted method 160 then ends.

FIG. 5 depicts a flowchart diagram of one embodiment of a method 180 for confirming the status of a data value permanently written to a memory location within the reprogrammable memory device. For convenience, the illustrated method 180 may be implemented with an embodiment of the computer device 100 and the controller 110 described above. Alternatively, the method 180 may be implemented with other reprogrammable memory devices and/or controllers for reprogrammable memory devices.

The depicted method 180 may be used to implement the test functions described above. The depicted method 180 begins as the controller 110 instructs the data value generator 130 to generate 182 a test data value. The test data value may be provided to the write engine 124 and also stored in one of the registers 138. The controller 110 then uses the write engine 124 to attempt 184 to write the test data value into the memory location that is being tested.

After attempting to write the test data value into the memory location, the controller 110 uses the read engine 126 to read 186 the data value that is currently stored in the indicated memory location. The controller 110 relies on the comparator 132 to compare 188 the stored data value of the selected memory element to the test data value generated by the data value generator 130.

If the stored data value read from the memory location is the same as the test data value, then it can be determined that the previously written data (prior to the test data) was not permanently stored in the memory location. This means that the memory location has not entered the write failure mode, but rather is still in a normal write mode. The comparator 132 may return 190 an indication of the normal write mode for the memory location.

In contrast, if the stored data value read from the memory location is different from the test data value, then it can be determined that the previously written data may be permanently stored in the memory location. This means that the memory location has entered the write failure mode, and subsequent write operations will not change the representative value of the stored data value. In this case, the comparator 132 may return 192 an indication of the write failure mode for the memory location. The depicted method 180 then ends.

In another embodiment, soft-read mechanisms may be used to implement read operations that are essentially non-destructive, but asymmetric. For example, OTP memory functionality may be useful in bringing a memory device from a "debug" mode to a "release" mode. In this transition, some of the debug capabilities can be fused out so that they are unavailable after the debug mode is exited. In an example, a byte of memory may be used in the debug mode to store the value 0×55 (0b01010101). To switch from the debug mode to the release mode, the opposite value 0×AA (0b10101010) may be written many times until the write failure state is reached. In this case, a simple read of the EEPROM can tell if the device is still in the debug mode, or if it's in the release mode. This approach is asymmetric because an attacker can easily change a reprogrammable EEPROM value to another value than 0×55 to pretend to be in release mode while the EEPROM is not yet burned. But in embodiments described herein, the fused state of the value stored in the memory element cannot be changed, so the memory device cannot be changed back from the release mode to the debug mode. So in this setup, the device can be in the debug mode and tested thousands of times without fear of prematurely fusing the EEPROM which means switching definitively to the release mode.

In further embodiments, it may be useful to establish an algorithm to find weak cells within a memory device and to designate some or all of the weak cells as the OTP memory elements 114. Weak cells may be characterized by reliability characteristics that are lower than the expected reliability characteristics for a given technology. For example, if some cells are identified as likely having fewer write cycles before reaching the write failure state, then those cells may be designated as weak cells and, consequently, as the OTP memory elements 114 of the memory device. In some embodiments, the application amplitude and/or time may render certain memory elements weaker and, consequently, more suitable for implementation of the OTP memory elements 114.

Embodiments described herein may include at least one memory controller coupled directly or indirectly to memory elements through a system bus such as a data, address, and/or control bus. The memory elements can include local memory employed during actual execution of program code, bulk storage, and cache memories which provide temporary storage of at least some program code in order to reduce the number of times code must be retrieved from bulk storage during execution.

It should also be noted that at least some of the operations for the methods described herein may be implemented using software instructions stored on a computer useable storage medium for execution by a computer. As an example, an embodiment of a computer program product includes a computer useable storage medium to store a computer readable program that, when executed on a computer, causes the computer to perform operations as described herein.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A storage device comprising:
a plurality of electrically erasable memory elements configured to store data, wherein each memory element is programmable a number of write cycles before reaching a write failure state; and
a controller coupled to the plurality of memory elements, wherein the controller comprises:
a receiver configured to receive an instruction to drive a selected memory element to the write failure state;
a write engine configured to perform a predetermined number of write operations to write a data value to the selected memory element that is an opposite of an initial data value stored in the selected memory element to switch the storage device out of a debug mode and to initiate a write operation to attempt to write a test data value to the selected memory element, wherein the data value comprises a non-zero sequence of at least three bits, and wherein the test data value is different from the data value; and
a comparator configured to generate a comparison result of a comparison of a stored data value of the selected memory element to the test data value, wherein the comparison result is indicative of whether the test data value is stored in the selected memory element, and wherein the write engine is further configured to perform a final set of additional write operations to attempt to write the data value to the selected memory element in response to a determination that the stored data value is not equal to the test data value.

2. The storage device of claim 1, wherein the write engine is further configured to perform additional write operations to write the data value to the selected memory element in response to a determination that the stored data value equals the test data value.

3. The storage device of claim 2, wherein the controller is further configured to control the write engine and the comparator to repeat:
the write operations to write the test data value;
the comparison; and
the additional write operations;
until the comparison result is indicative that the stored data value does not equal the test data value.

4. The storage device of claim 1, wherein the write engine is further configured to:
perform a first sequence of the write operations to repeatedly write the data value to the selected memory element, wherein the first sequence of the write operations comprises a number of write operations equal to or greater than a first threshold number of write cycles; and
perform a second sequence of the write operations to write the data value to the selected memory element in response to a determination that the selected memory element can store a newly written data value.

5. The storage device of claim 4, wherein the controller further comprises:
a read engine configured to read a stored data value from the selected memory element after each sequence of the write operations; and
wherein the write engine is further configured to repeat the second sequence of the write operations in response to a subsequent determination that the selected memory element can store another newly written data value.

6. The storage device of claim 5, wherein the controller further comprises:
a data value generator to generate an arbitrary data value;
wherein the write engine is further configured to write the arbitrary data value to the selected memory element prior to the read engine reading the stored data value; and
a comparator configured to compare the stored data value of the selected memory element to the arbitrary data value to determine if the arbitrary data value is stored in the selected memory element.

7. The storage device of claim 1, wherein the controller is further configured to manage a map of the plurality of memory elements, wherein the map designates blocks of the memory elements to drive to the write failure state for storage of fused data values that cannot be changed by subsequent write operations.

8. The storage device of claim 7, wherein the controller further comprises an override engine, wherein the override engine prevents wear leveling procedures for the blocks of the memory elements designated in the map for storage of the fused data values.

9. A method comprising:
receiving an instruction to drive a selected block of memory elements to a write failure state to permanently store a data value;
performing a predetermined number of write operations to write a data value to the selected block of memory elements that is an opposite of an initial data value stored in the selected memory element to switch the storage device out of a debug mode, wherein the data value comprises a non-zero sequence of at least three bits;
initiating a write operation to attempt to write a test data value to the selected block of memory elements, wherein the test data value is different from the data value;
generating a comparison result of a comparison of a stored data value of the selected block of memory elements to the test data value, wherein the comparison result is indicative of whether the test data value is stored in the selected block of memory elements; and
performing a final set of additional write operations to attempt to write the data value to the selected block of memory elements in response to a determination that the stored data value is not equal to the test data value.

10. The method of claim 9, wherein performing the plurality of repetitive write operations further comprises rewriting the data value to the selected block of memory elements until the write failure state is achieved for the selected block of memory elements.

11. The method of claim 9, further comprising:
determining that the stored data value is equal to the test data value; and
performing an additional sequence of write operations to attempt to write the data value to the selected block of memory elements to achieve the write failure mode of the selected block of memory elements.

12. The method of claim 9, further comprising reserving a portion of the plurality of electrically erasable memory elements for driving to the write failure state and storing data that cannot be changed by subsequent write operations.

13. The method of claim 9, further comprising preventing application of wear leveling techniques to the selected block of memory elements.

14. A system comprising:
   a plurality of rewritable memory elements within a memory device, wherein at least some of the memory elements are designated for use in a state in which the designated memory elements cannot be rewritten; and
   a controller coupled to the plurality of memory elements, wherein the controller comprises:
      a read engine to read a stored data value from a block within the designated memory elements;
      a write engine configured to perform a predetermined number of a write operations to write a data value to the block within the designated memory elements that is an opposite of an initial data value stored in the selected memory element to switch the storage device out of a debug mode and to initiate a write operation to attempt to write a test data value to the block within the designated memory elements, wherein the data value comprises a non-zero sequence of at least three bits, and wherein the test data value is different from the data value; and
      a comparator configured to generate a comparison result of a comparison of a stored data value of the block within the designated memory elements to the test data value, wherein the comparison result is indicative of whether the test data value is stored in the block within the designated memory elements, and wherein the write engine is further configured to perform a final set of additional write operations to attempt to write the data value to the block within the designated memory elements in response to a determination that the stored data value is not equal to the test data value.

15. The system of claim 14, wherein the controller is further configured to store a designation of the block within the designated memory elements as storing a fused data value that cannot be changed by a subsequent write operation.

* * * * *